United States Patent [19]

Thorstenson

[11] Patent Number: 4,867,098
[45] Date of Patent: Sep. 19, 1989

[54] AUTOMATED LEAD WIRE TINNING DRIVE ROLLER IMPROVEMENTS

[75] Inventor: Stanley C. Thorstenson, St. Paul, Minn.

[73] Assignee: Honeywell Inc., Minneapolis, Minn.

[21] Appl. No.: 253,296

[22] Filed: Oct. 5, 1988

[51] Int. Cl.$^4$ .............................................. B05D 5/12
[52] U.S. Cl. ...................................... 118/424; 29/759; 118/74; 206/330; 226/190
[58] Field of Search ................. 118/74, 423, 424, 703, 118/500, 400, 427, 428, 694, 686, 63, 410, 422, 426; 29/759 X; 206/330 X; 226/153, 181, 182, 183, 190 X

[56] References Cited

U.S. PATENT DOCUMENTS

| | | | |
|---|---|---|---|
| 3,171,535 | 3/1965 | Harris | 206/330 |
| 3,587,524 | 6/1971 | Keating | 118/500 |
| 3,596,486 | 8/1971 | Dolder | 206/330 |
| 4,079,509 | 3/1978 | Jackson | 29/759 |
| 4,327,482 | 5/1982 | Araki et al. | 29/759 |
| 4,491,084 | 1/1985 | Marshall, Jr. | 118/683 |
| 4,573,430 | 3/1986 | Benson et al. | 118/411 |

*Primary Examiner*—Willard E. Hoag
*Attorney, Agent, or Firm*—Donald A. Jacobson

[57] ABSTRACT

A driver and an idler roller in contact with one another are used to drive a pair of tapes carrying components through solder wave tinning apparatus immediately prior to winding the tapes and components for storage. The rollers are made of conductive material to remove electrostatic charges from the tapes and components induced by their movement through the apparatus to prevent damaging electrostatic sensitive components.

4 Claims, 3 Drawing Sheets

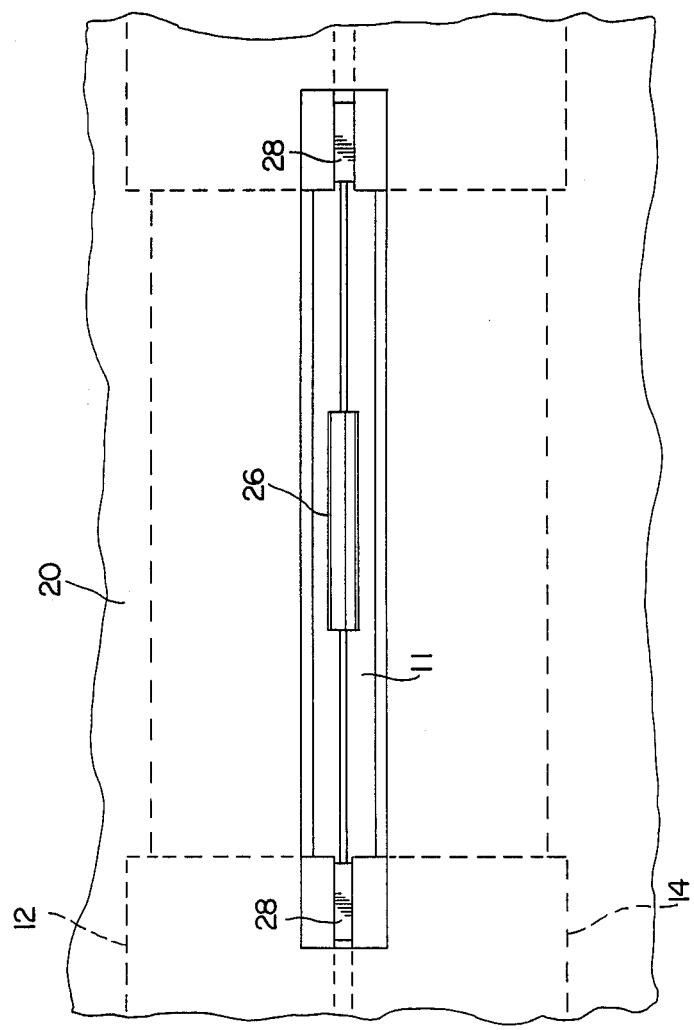

AUTOMATED LEAD WIRE TINNING DRIVE ROLLER IMPROVEMENTS

FIELD OF THE INVENTION

This invention relates to the field of electrical manufacturing and particularly to means for tinning the conductors of components supplied in taping rolls in situ on the tape.

REFERENCE TO RELATED APPLICATIONS

This application is related to the following commonly-assigned applications filed concurrently herewith:

| Title | Ser. No. |
| --- | --- |
| Automated Lead Wire Tinning Apparatus Mechanical Adjustments and Improvements | 07/253,295 |
| Automated Lead Wire Tinning Apparatus Improvements | 07/253,294 |
| Automated Lead Wire Tinning Solder Wave Improvements | 07/253,297 |

BACKGROUND OF THE INVENTION

Previous inventions addressed the problems of automatically tinning components supplied mounted on long tapes and on spools or reels. In Marshall, Jr., U.S. Pat. No. 4,491,084 the use of apparatus which first removes components from the tape then tins the lead by moving the component in a vertical orientation through a series of stations and finally applying a new tape is taught.

In Benson et al, U.S. Pat. No. 4,573,430, which was also assigned to the instant assignee, apparatus was described which can tin components without the necessity of first removing them from their connecting tape. In using this apparatus a number of problems were encountered. Some of these problems were addressed in the co-pending applications listed above.

The problem addressed here in using this apparatus pertains to electrostatic voltages induced on the tapes during the operation of this apparatus. The two adhesive support tapes tying the components together are made of paper which is an insulator. In moving these tapes through the tinning apparatus these tapes will pick up an electrostatic charge. Since many of the tinned components are sensitive to electrostatic voltages and can be destroyed by electrostatic charges this presents a serious problem when tinning such components.

BRIEF SUMMARY OF THE INVENTION

The instant invention utilizes the basic structure of the aforementioned Benson et al patent to automatically tin the leads of tape-stored electrical components. The following improvements have been incorporated into this basic structure to eliminate the above described problems of this apparatus.

The drive mechanism for the tape has been modified to include a pair of plastic rollers, which are non-injurious to the tape, having a carbon filler to make the rollers conductive. This conductivity bleeds any electrostatic charges from the tapes immediately before storage and after tinning while providing a non-injurious plastic surface against the tape. Two such conductive reels are used in contact with each other. One reel is externally driven and drives the second reel by friction. Interposing the tape between these two reels provides for the electrostatic charge removal.

BRIEF DESCRIPTION OF THE DRAWINGS

FIG. 2 is a perspective front view of the rollers, take up reel, and adjoining tapes holding components being fed through.

FIG. 2A is a perspective of the roller feed slot of the components and tapes.

DETAILED DESCRIPTION OF THE PREFERRED EMBODIMENT

Figure 3:
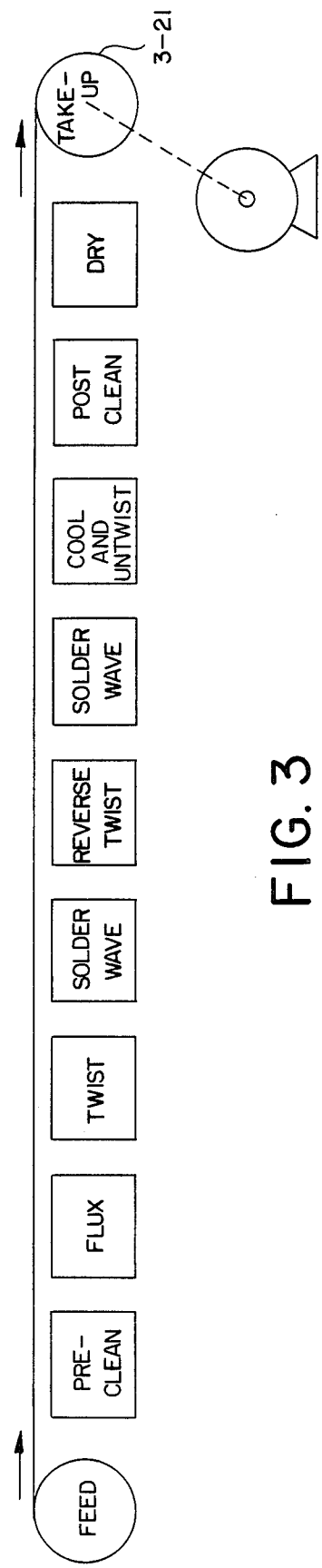
FIG. 3 is a block diagram of a lead wire tinning system according to Benson et al.

FIG. 3 shows the block diagram of automatic lead wire tinning apparatus according to Benson et al. My improvement to this apparatus occurs in the process immediately prior to the take-up reel 3-21. This number is the same as that used on the Benson patent with a 3 prefix. The terminology of this previous patent is retained here to clarify the discussions.

Figure 1:
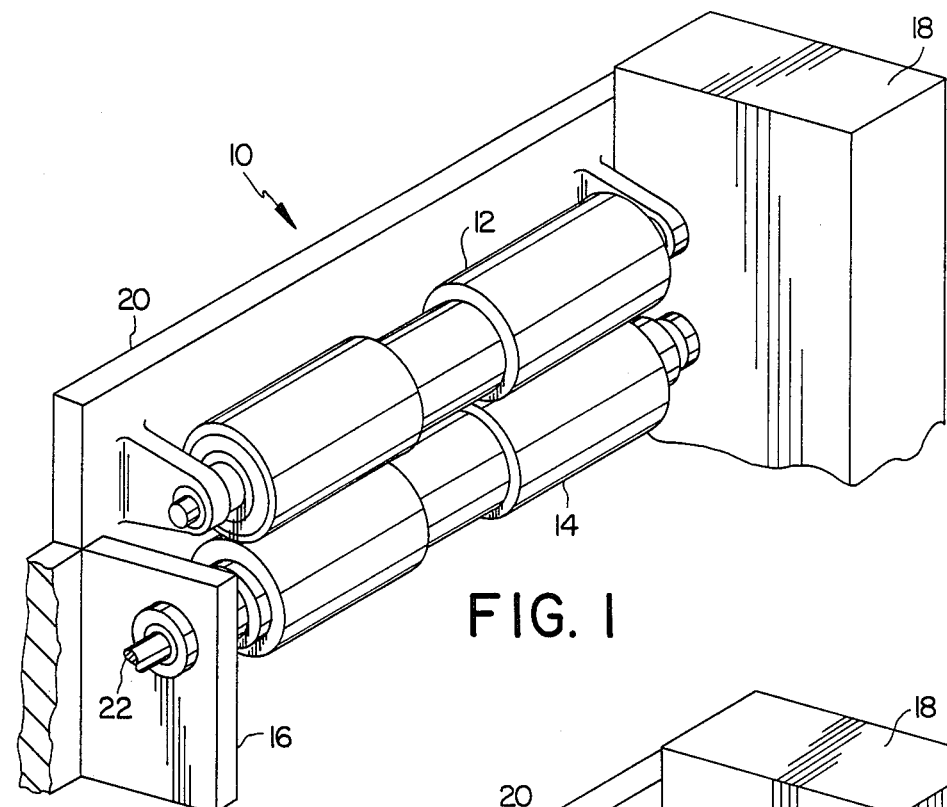
FIG. 1 is a perspective view of the rollers.
Figure 2:
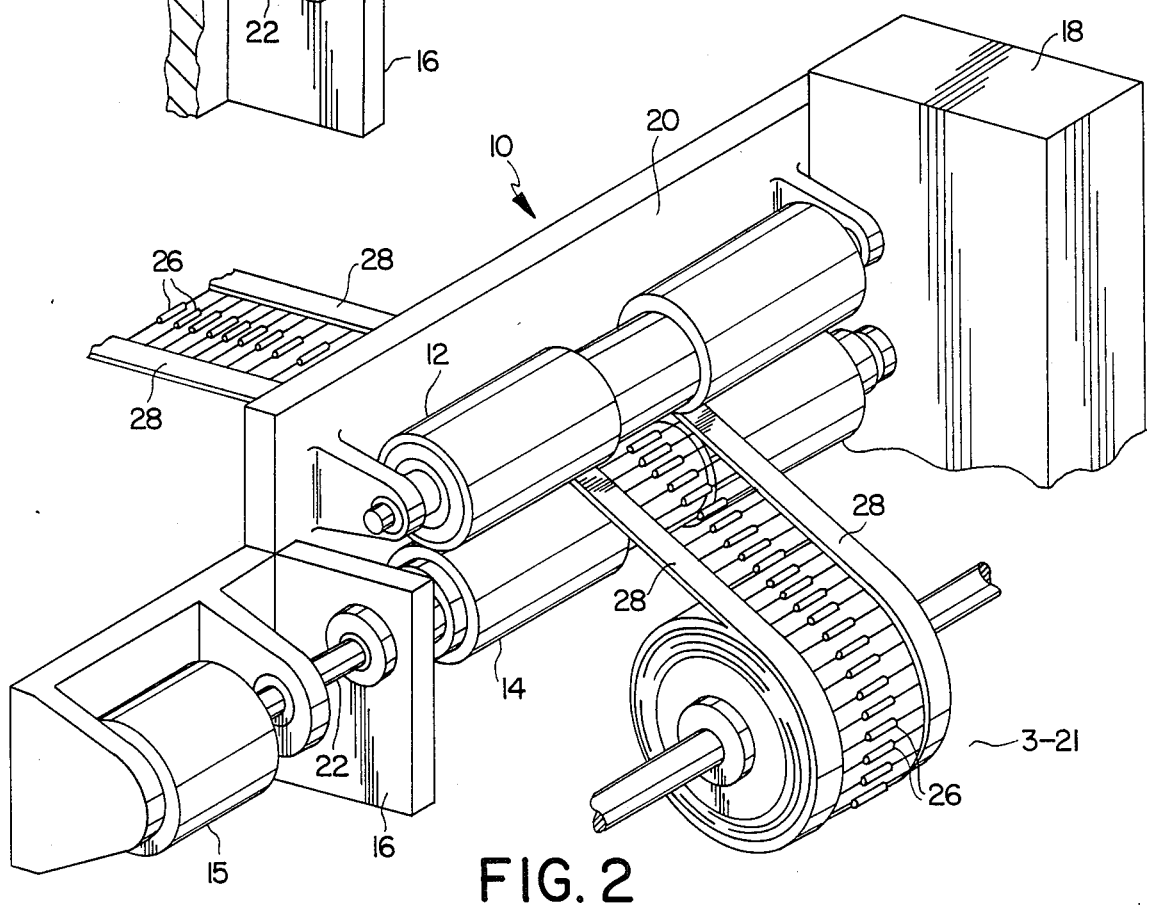

In FIGS. 1 and 2 tape drive mechanism 10 can be seen. Drive mechanism 10 consists of an upper idler roller 12 in contact with a lower drive roller 14. Rollers 12 and 14 each have a reduced diameter in the center and metal axles, the purpose of which will be described later.

Drive roller 14 is mounted between a metal horizontal support projection 16 and a metal supportive structure 18 for the entire mechanism. The bearings for roller 12 to permit the roller to turn freely are mounted on standoffs extending from the adjacent wall 20. The bearings for roller 14 are mounted in horizontal projection 16 and support structure 18. Axle 22 extends through projection 16 to an electric motor 15.

In FIGS. 2 and 2A drive mechanism 10 having taper 28 with interposed components 26 feeding the mechanism can be seen. A slot 11 in wall 20, permits tapes 28 and components 26 to be fed from guide rails 24 through the wall to the drive rollers. The smaller diameter of the center section of rollers 12 and 14 permit components 26 to pass freely between the rollers while permitting the tapes 28 holding the components together, to be gripped tightly. Rollers 12 and 14 are made of plastic mixed with carbon black to provide a conductive path for any electrostatic charges previously induced in tapes 26 by their handling in the tinning apparatus.

Drive roller 14 is driven by an electric motor 15 which drives roller 14 directly and roller 12 by friction to pull tapes 28 between them. This arrangement of rollers 12 and 14 provides a conductive path for any electrostatic charge which may have accumulated on the tapes 28 and components 26 during the tinning process. Removing this electrostatic charge immediately before winding the tape on take-up reel 3-21 assures that no additional charges will be accumulated before storage. This improvement has eliminated the electrostatic problem described earlier.

While this invention has been described with reference to an illustrative embodiment, this description is not intended to be construed in a limiting sense. Various modifications of the illustrative embodiment, as well as other embodiments of the invention, will be apparent to persons skilled in the art upon reference t this description. It is therefore contemplated that the appended claims will cover any such modifications or embodiments as fall within the true scope of the invention.

What is claimed is:

1. In apparatus for automatically tinning tape mounted component leads using solder waves the improvement comprising: drive means arranged to propel and contact tapes, which are used to secure components together, having conductive means, whereby electrostatic charges are removed from the tapes.

2. Apparatus as in claim 1 wherein the drive means comprises a drive roller driven by an electric motor and an idler roller whereby the drive roller is in frictional contact with the idler roller, and wherein the conductive means comprises conductive material forming the surface of the rollers and having a conductive metal axle.

3. Apparatus as in claim 2 having the drive and roller reduced in diameter in the central portion of the surface, such that components carried between the rollers will not contact said rollers.

4. Apparatus as in claim 2 wherein the conductive material comprises plastic material intermixed with carbon such that the resulting mixture is rendered conductive to electricity.

* * * * *